(12) United States Patent
Nishisaka

(10) Patent No.: US 8,669,620 B2
(45) Date of Patent: Mar. 11, 2014

(54) SEMICONDUCTOR DEVICE AND METHOD OF MANUFACTURING THE SAME

(76) Inventor: Mika Nishisaka, Tokyo (JP)

( * ) Notice: Subject to any disclaimer, the term of this patent is extended or adjusted under 35 U.S.C. 154(b) by 42 days.

(21) Appl. No.: 13/331,574

(22) Filed: Dec. 20, 2011

(65) Prior Publication Data

US 2013/0154013 A1    Jun. 20, 2013

(51) Int. Cl.
    *H01L 21/00*    (2006.01)
(52) U.S. Cl.
    USPC .... 257/369; 257/372; 257/392; 257/E29.239; 257/E29.255; 257/E27.062
(58) Field of Classification Search
    USPC ......... 257/190, 369–372, 392, 410, 411, 471, 257/E29.234, 255, 27.062, 68, 98
    See application file for complete search history.

(56) References Cited

U.S. PATENT DOCUMENTS

| | | | |
|---|---|---|---|
| 6,175,138 B1* | 1/2001 | Noda | 257/392 |
| 7,821,075 B2* | 10/2010 | Snyder et al. | 257/371 |
| 8,120,960 B2* | 2/2012 | Varkony | 365/185.16 |
| 2006/0019440 A1* | 1/2006 | Tran | 438/218 |
| 2006/0079068 A1* | 4/2006 | Sheu et al. | 438/433 |
| 2007/0215958 A1* | 9/2007 | Tanaka et al. | 257/411 |
| 2008/0099786 A1* | 5/2008 | Maeda et al. | 257/190 |
| 2011/0034016 A1* | 2/2011 | Snyder et al. | 438/586 |
| 2012/0080756 A1* | 4/2012 | Suzuki et al. | 257/369 |

* cited by examiner

*Primary Examiner* — Michael Lebentritt
(74) *Attorney, Agent, or Firm* — Young & Thompson

(57) ABSTRACT

A semiconductor device is provided, which includes a circuit including a first MOS transistor having a gate connected to a first signal line, a second MOS transistor having a gate connected to a second signal line, and the circuit outputting an output signal according to a difference in potential between the first signal line and the second signal line, wherein channel regions of the first and second MOS transistors include no maximum impurity concentration at an area, which is shallower than a depth indicating a maximum concentration of one conduction type impurity that forms source and drain regions of the MOS transistors.

14 Claims, 5 Drawing Sheets

IMPURITY PROFILE

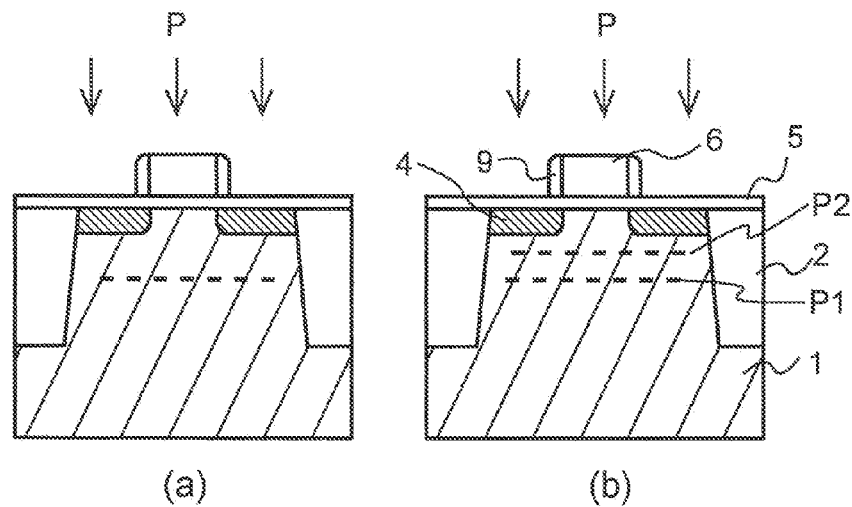
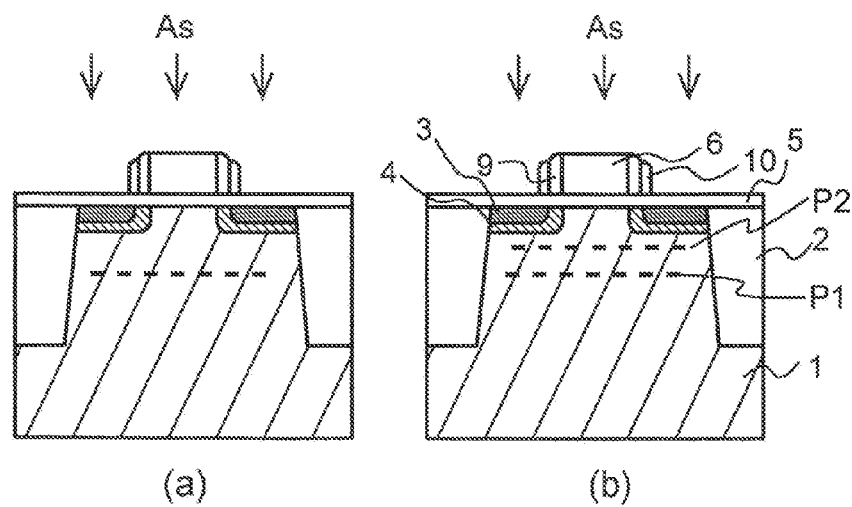

SEMICONDUCTOR DEVICE AND METHOD OF MANUFACTURING THE SAME

FIELD OF THE INVENTION

The present invention relates to a semiconductor device including MOS transistors and a manufacturing method thereof.

DESCRIPTION OF THE RELATED ART

MOS transistors have been widely used as devices that constitute a semiconductor integrated circuit device. With the high performance and functionalization of semiconductor integrated circuit device, the structure of a MOS transistor has been changed. As is disclosed in JP HEI 10-74941, there has been a technique which suppresses punch-through between a source and a drain through ion-implantation of impurities having the same conductivity as a silicon substrate into a relatively deep region of a channel region of a MOS transistor and controls a threshold voltage of the MOS transistor through control of the impurity concentration of the surface of the silicon substrate of the channel region in the case where the length of a gate is relatively long. However, if the threshold voltage is set to a desired value in a state where the channel length is short, the punch-through voltage is lowered, while if the punch-through voltage is set to a desired value, the threshold voltage is heightened. Accordingly, it is commonly used that an impurity implantation layer that controls the threshold voltage is provided on a shallow area of the channel region separately from the impurity implantation layer having a concentration peak in a deep position of the channel region that controls the punch-through voltage.

On the other hand, one of semiconductor integrated circuit devices using MOS transistors may be a DRAM. Since the DRAM can store one-bit information through one MOS transistor and one capacitor, it is suitable for high integration, and makes it possible to read and write information with relatively small electric power and at relatively high speed, resulting in that the DRAM has been widely installed in electronic devices. However, with the high integration, the amount of signal that is read from a memory cell is getting smaller every generation. This read signal is obtained as a potential difference between a pair of bit lines, and a sense amplifier that is connected to the pair of bit lines determines whether the stored information is 1 or 0 from the potential difference between the bit lines. As the sense amplifier, a pair of cross-coupled MOS transistors is used, and each of the pair of bit lines is configured to be connected to each gate electrode of the pair of MOS transistors. Ideally, the pair of MOS transistors is required so that the electrical characteristics thereof fully coincide with each other. However, in reality, the electrical characteristics of the pair of MOS transistors do not fully coincide with each other, and since the electrical characteristics thereof differ from each other due to the production tolerance, the sense amplifier has a minimum input potential difference (that is called sensitivity) that can work properly. Further, the sensitivity of even a plurality of sense amplifiers provided on the same semiconductor chip may vary due to the production tolerance. As one of causes of such variation of the sensitivity, the threshold voltage variation of a pair of MOS transistors is important.

Recent years, with the high integration of semiconductor integrated circuit and the acceleration of operating speed, the deterioration of the sensitivity of a DRAM sense amplifier becomes noticeable to cause deterioration of the operating margin and reduction in yield.

SUMMARY OF THE INVENTION

The inventor has found that variation of the threshold voltage of the MOS transistor becomes very large in the case where impurities having maximum concentration are implanted into a shallow area of the channel region.

In a first aspect of the present invention, there is provided a semiconductor device which includes first and second MOS transistors, each MOS transistor including source and drain regions formed on a main surface of a semiconductor substrate, a channel region sandwiched between the source and drain regions, and a gate electrode provided over the channel region through a gate insulating film; and a circuit including the first MOS transistor whose gate is connected to a first signal line and the second MOS transistor whose gate is connected to a second signal line, the circuit outputting an output signal according to a difference in potential between the first signal line and the second signal line, wherein the channel regions of the first and second MOS transistors include no maximum impurity concentration at an area, which is shallower than a depth indicating a maximum concentration of one conduction type impurity that forms the source and drain regions.

In a second aspect of the present invention, there is provided a semiconductor device which includes a first MOS transistor including source and drain regions formed on a main surface of a semiconductor substrate, a channel region sandwiched between the source and drain regions and a gate electrode provided over the channel region through a gate insulating film; and a circuit including the first MOS transistor whose gate electrode receives an input signal having an intermediate potential between a power supply potential and a ground potential, the circuit outputting an output signal according to the potential of the input signal, wherein the channel region of the first MOS transistor includes no maximum impurity concentration at an area, which is shallower than a depth indicating a maximum concentration of one conduction type impurity that forms the source and drain regions.

In a third aspect of the present invention, there is provided a semiconductor device which includes first, second, and third MOS transistors, each MOS transistor including source and drain regions formed on a main surface of a semiconductor substrate, a channel region sandwiched between the source and drain regions and a gate electrode provided over the channel region through a gate insulating film; and a circuit including the first MOS transistor whose gate is connected to a first signal line and the second MOS transistor whose gate is connected to a second signal line, the circuit outputting an output signal according to a difference in potential between the first signal line and the second signal line, wherein the channel regions of the first, second, and third MOS transistors include no maximum impurity concentration at an area, which is shallower than a depth indicating a maximum concentration of one conduction type impurity that forms the source and drain regions and contain a first impurity whose concentration has a maximum value at an area, which is deeper than the depth indicating the maximum concentration of the one conduction type impurity that forms the source and drain regions, and is simply decreased from the depth indicating the maximum value of the concentration of the first impurity toward the surface of the semiconductor substrate; and the third MOS transistor further contains a second impurity whose concentration has a maximum value at an area, which is much deeper than the depth indicating the maximum concentration of the one conduction type impurity that forms the source and drain regions, and is simply decreased from the depth indicating the maximum value of the concentration of the second impurity toward the surface of the semiconductor substrate.

In a fourth aspect of the present invention, there is provided a method of manufacturing a semiconductor device, which includes first and second MOS transistors, each MOS transistor including source and drain regions formed on a main surface of a semiconductor substrate, a channel region sandwiched between the source and drain regions, and a gate electrode provided over the channel region through a gate insulating film; and a circuit comprising the first MOS transistor whose gate is connected to a first signal line and the second MOS transistor whose gate is connected to a second signal line, the circuit outputting an output signal according to a difference in potential between the first signal line and the second signal line, the method including no step of implanting one conduction type impurity into the channel regions of the first and second MOS transistors so that a concentration of the one conduction type impurity has a maximum value at an area, which is shallower than a depth indicating the maximum concentration of the other conduction type impurity that forms the source and drain regions.

BRIEF DESCRIPTION OF THE DRAWINGS

FIG. 5 is a cross-sectional view of process schematically illustrating a method of manufacturing a semiconductor device according to an embodiment of the present invention.

FIG. 6 is a cross-sectional view of process schematically illustrating a method of manufacturing a semiconductor device according to an embodiment of the present invention.

DETAILED DESCRIPTION OF THE EMBODIMENTS

One embodiment of the present invention will be described using the drawings.

Figure 7:
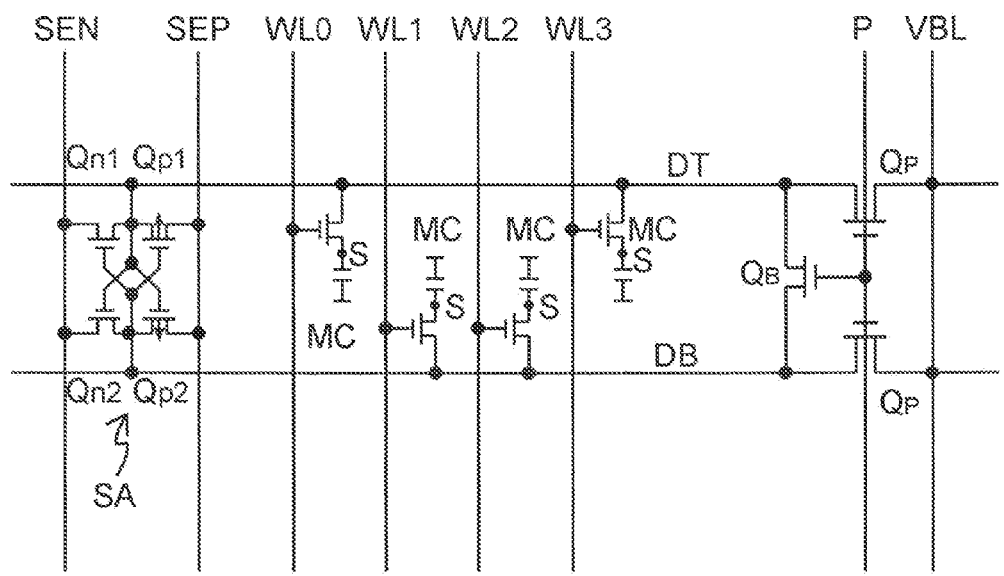
FIG. 7 is a circuit diagram illustrating the configuration of a main part of a DRAM that is an example that is suitable for applying the present invention.
Figure 8:
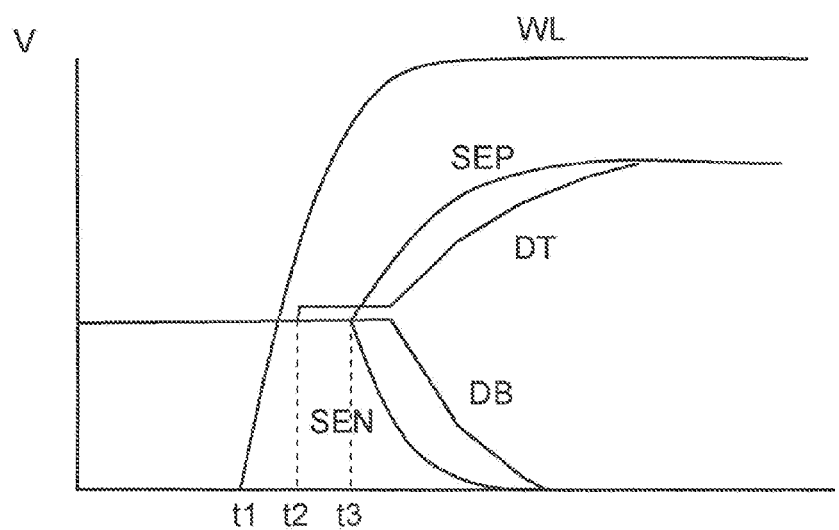
FIG. 8 is a waveform chart illustrating the outline of a read operation of information written in a memory cell.

FIG. 7 is a circuit diagram illustrating the configuration of a main part of a DRAM that is one of suitable examples for applying the present invention, and FIG. 8 is a waveform chart illustrating the outline of a read operation of information written in a memory cell.

Memory cells MC, in which each one is composed of one N-channel MOS transistor and one capacitor, are provided at each intersection of word lines WLn and bit lines DT and DB. A gate of the MOS transistor is connected to the word line WL and any one of a source and a drain is connected to the bit line DT or DB. The bit lines DT and DB are connected to a sense amplifier SA that is composed of four MOS transistors Qn1, Qn2, Qp1, and Qp2, and are connected to a power supply line VBL for bit lines through the MOS transistor Qp driven by a pre-charge signal P. Further, between the bit lines DT and DB, a MOS transistor Qb that is driven by the pre-charge signal P is provided. In the sense amplifier SA, N-channel MOS transistors Qn1 and Qn2 are cross-coupled, and their sources are connected to a sense amplifier drive line SEN. P-channel MOS transistors Qp1 and Qp2 are cross-coupled, and their sources are connected to a sense amplifier drive line SEP. In the actual semiconductor device, memory cells MC are array-arranged.

On a storage node S of each memory cell MC, potential of cell H or cell L is pre-written by a write circuit that is not illustrated. Typically, a power supply potential $V_{array}$ of a memory cell array region is given to cell H, and a ground potential Vs is given to cell L.

Then, referring to FIG. 8, the outline of a write operation of information written in a memory cell will be described.

Before a read operation, the bit lines DT and DB and the sense amplifier drive lines SEN and SEP are all kept with the potential of the power supply line VBL for bit lines. The power supply line VBL for bit lines typically has an intermediate potential between the power supply potential $V_{array}$ of a memory cell array region of cell H and a ground potential of cell L. Before entering the read operation, the pre-charge signal is reset, and the bit lines DT and DB and the power supply line VBL for bit lines are separated from each other. Then, at t1, a selected word line, for example, WL0, starts transition to H, and a capacitor of the memory cell and the bit line DT are connected to each other, so that charge transfer is made between the capacitor and the bit line DT. For example, if cell H is given to the storage node S of the selected memory cell MC, the potential of the bit line DT is increased as much as $\Delta V$ (t2). On the other hand, since the selected memory cell is not connected to the bit line DB, the supply voltage for bit lines is kept on the bit line DB. Then, at t3, the sense amplifier drive line SEN starts transition from the power supply potential for bit lines to the ground potential, and SEP starts transition from the power supply potential for bit lines to the power supply potential $V_{array}$ of the memory cell array region. The small signal input to the sense amplifier is amplified and then is output to the input node pair.

When attention is paid to the N-channel MOS transistors of the sense amplifier, the gate of the N-channel MOS transistor Qn1 is connected to the bit line DB, and the gate of the N-channel MOS transistor Qn2 is connected to the bit line DT. At t2, the potential of the bit line DT is increased as much as $\Delta V$, and thus the conductance of the N-channel MOS transistor Qn2 is increased in response to this increase. Accordingly, the bit line DT outputs H, while the bit line DB outputs L. This sense amplifier circuit is an amplifier circuit having the same input and output terminals.

Further, when attention is paid to the N-channel MOS transistor Qn2, the intermediate potential between the power supply potential $V_{array}$ of the memory cell array region and the ground potential Vs is input to the gate of the N-channel MOS transistor Qn2, and as the conductance of the channel of the N-channel MOS transistor Qn2 is changed in response to the change of the input voltage, the output voltage to the bit line DB is determined.

At this time, the conductance value of the channel to the input voltage that is input to the gate of the N-channel MOS transistor Qn2 is changed significantly with change in threshold value to lead to malfunction. Then, another example suitable for applying the present invention will be described.

Figure 9:
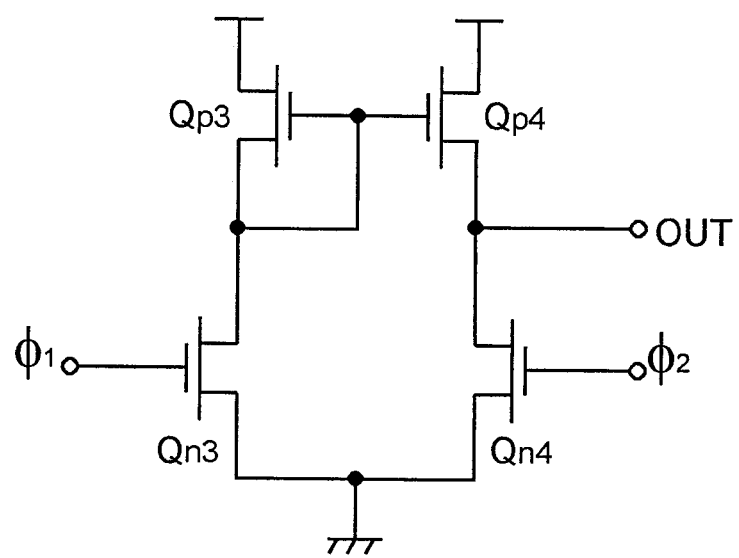
FIG. 9 is a circuit diagram of a current mirror differential amplifier circuit.

FIG. 9 is a circuit diagram of a current mirror differential amplifier circuit. P-channel MOS transistors Qp3 and Qp4 constitute a current mirror circuit. Signals φ1 and φ2 are connected to respective gates of N-channel MOS transistors Qn3 and Qn4, and an output voltage of an output OUT is determined according to a difference voltage between the input signals φ1 and φ2. When attention is paid to the N-channel MOS transistors Qn3 and Qn4, for example, if it is assumed that the input signal φ2 is fixed to a constant value, the input signal φ1, which is a signal that varies around the intermediate value between the power supply voltage and the ground voltage, is input to the gate of the N-channel MOS transistor Qn3, and the conductance of the channel varies according to the variation of the input signal φ1 to vary the output voltage of the output terminal OUT.

Figure 1:
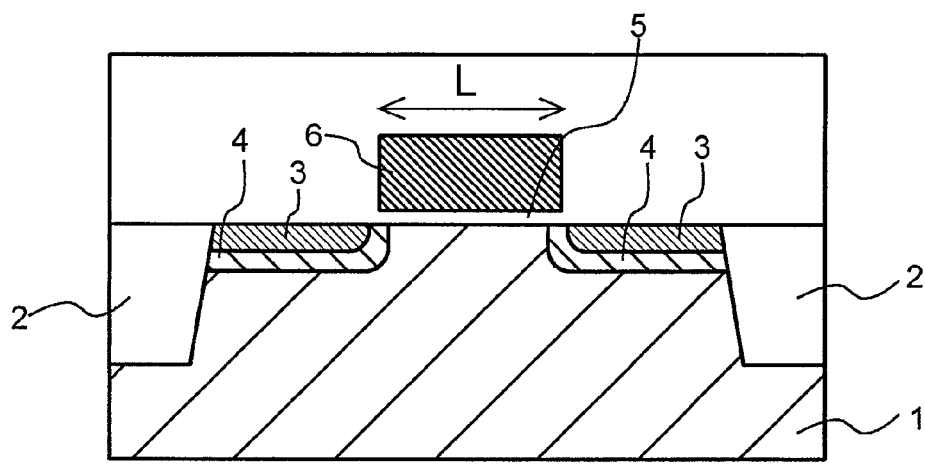
FIG. 1 is a cross-sectional view of an N-channel MOS transistor according to an embodiment of the present invention.
Figure 2:
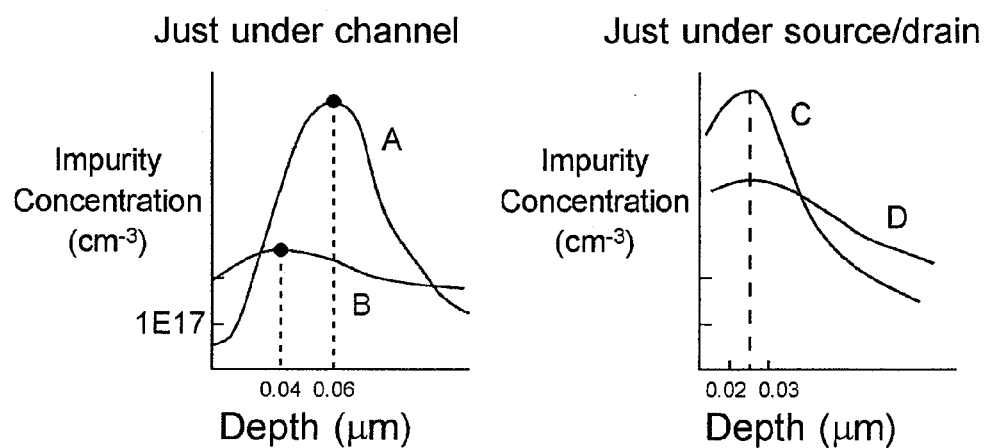
FIG. 2 is a diagram illustrating an impurity profile in a depth direction of a silicon substrate of an N-channel MOS transistor according to an embodiment of the present invention.

Then, an example of an N-channel MOS transistor in a semiconductor device according to an embodiment of the present invention will be described. FIG. 1 is a cross-sectional view of an N-channel MOS transistor according to an embodiment of the present invention. FIG. 2(a) schematically illustrates an impurity profile in a depth direction of a silicon substrate of a channel region of this MOS transistor, and FIG. 2(b) schematically illustrates an impurity profile in a depth direction of a silicon substrate of source and drain regions of this MOS transistor. As illustrated in FIG. 1, a trench isolation region (STI) is formed on the surface of a P-type silicon substrate 1, N-type source and drain regions are formed on an active region that is determined by the trench isolation region, and a gate electrode 6 is formed on the silicon substrate surface of the channel region that is sandwiched between the N-type source and drain regions through a gate insulating film 5. The N-type source and drain are formed of a phosphorus-introduced low concentration N-type LDD portion 4 and an arsenic-introduced high concentration N-type source and drain portions 3. Here, known techniques may be combined with respect to the source and drain structure. Further, known techniques may be combined with respect to the shape of the channel, such as trench type, fin type, and side walls of a silicon pillar.

FIG. 2(a) schematically illustrates an impurity profile in a vertical depth direction from the silicon substrate surface of the channel region of the silicon substrate 1. FIG. 2(b) schematically illustrates an impurity profile in a vertical depth direction from the silicon substrate surface of the source and drain regions of the silicon substrate 1. In this embodiment, the impurity profile just under the source and drain regions, as illustrated in FIG. 2(b), includes an impurity profile C that forms the source and drain into which high concentration arsenic is introduced, and an impurity profile D into low concentration phosphorus is introduced, and the depth of their concentration peaks are almost identical and in the range of 20 to 30 nm. On the other hand, with respect to the impurity profile just under the channel region, particularly, only the impurity profile A of FIG. 2(a) is adopted to the N-channel MOS transistors Qn1 and Qn2 that constitute the above-described DRAM sense amplifier. As the impurity, indium having a relatively large mass number is used, and the depth of about 60 nm is set so that the concentration peak occurs at a position that is deeper than the depth of the peak of the concentration of the impurity that forms the source and drain. By using ion species having a relatively large mass number, the spread of the impurity profile just after ion implantation becomes small, and even if the concentration that is sufficient to suppress the punch-through around the peak is ensured, the concentration of the substrate surface is sufficiently suppressed. In case of indium, the profile is not greatly changed even through heat treatment after various kinds of processes after implantation, and thus is preferable. Through doing so, there is no impurity layer having concentration peak in an area, which is shallower than the depth of the peak of the concentration of the impurity that forms the source and drain, and thus the variation of the threshold value of the MOS transistor can be suppressed. It is preferable to suppress the impurity concentration of the substrate surface to be equal to or lower than 1E17. In this case, although the threshold value is relatively small, the gate length L can be longer than the other MOS transistor gate length. Further, in the case of a MOS transistor including high-k gate insulating film, lowering of the impurity concentration of the substrate surface is preferable to suppress the degradation of the carrier mobility. The MOS transistor including the high-k gate insulating film performs threshold value adjustment by a work function of the gate electrode. Further, the threshold value may be adjusted by the impurity of the substrate without introducing the impurity later. Further, in the case where a circuit that requires MOS transistors having a threshold value that is different from the threshold value optimized by the sense amplifier is included in the circuit that is mounted in the semiconductor device, the threshold value adjustment of such MOS transistors is obtained by combining the impurity profile A and the impurity profile B shown in FIG. 2(a). It is preferable that the impurity profile B is set to have a peak at a depth shallower than the depth of the peak of the impurity profile A. By using boron having a relatively small mass number, the threshold value can be adjusted with low acceleration energy and small dose amount. Further, the damage of the silicon substrate can be reduced.

Then, a method of manufacturing a semiconductor device according to an embodiment of the present invention will be described. FIGS. 3 to 6 are cross-sectional views of processes schematically illustrating a method of manufacturing a semiconductor device according to an embodiment of the present invention. FIGS. 3(a) to 6(a) are cross-sectional views of processes of an N-channel MOS transistor Qn1 constituting a DRAM sense amplifier, and FIGS. 3(b) to 6(b) are cross-section views of processes of other typical MOS transistors.

Figure 3:
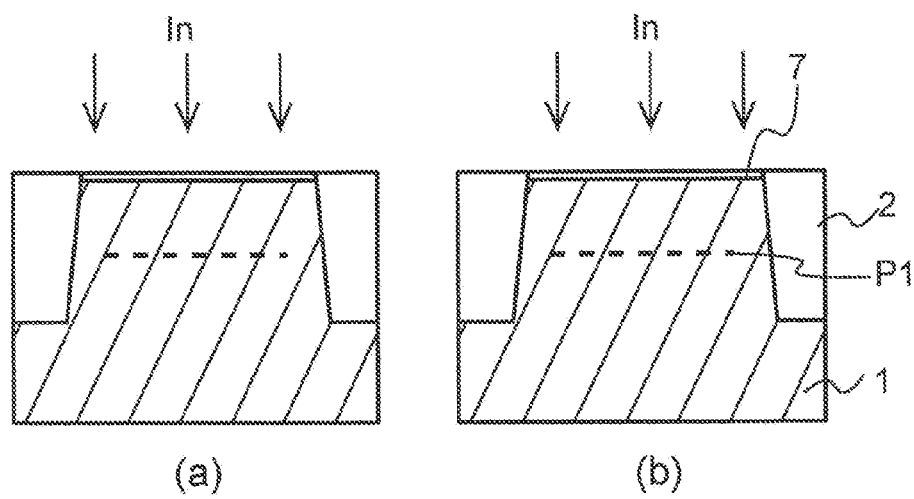
FIG. 3 is a cross-sectional view of process schematically illustrating a method of manufacturing a semiconductor device according to an embodiment of the present invention.

First, as illustrated in FIG. 3, a silicon oxide film 7 is formed on the surface of the silicon substrate 1 on which an STI device isolation region 2 is formed, and indium is ion-implanted onto an active region of the silicon substrate through the silicon oxide film. With respect to the profile in the depth direction of the channel region of indium, a peak P1 of indium is set at a position that is deeper than the depth of the impurity during formation of the source and drain, for example, at a depth of 60 nm. The concentration of the peak is set to a value that is sufficient to suppress the punch-through.

Figure 4:
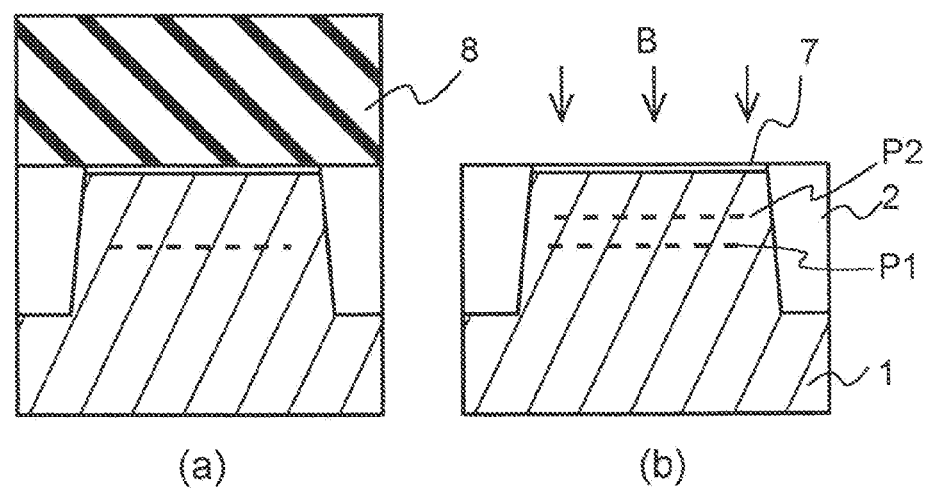
FIG. 4 is a cross-sectional view of process schematically illustrating a method of manufacturing a semiconductor device according to an embodiment of the present invention.

Then, as illustrated in FIG. 4, the active region of the N-channel MOS transistor Qn1 constituting the DRAM sense amplifier is covered with resist 8, and ion-implantation for adjusting the threshold value is performed. The ion-implantation for adjusting the threshold value is performed using boron, and the depth of a peak P2 of boron is set so that the peak P2 is shallower than the peak P1 of indium, for example, is set to 40 nm.

Then, as illustrated in FIG. 5, a gate insulating film is formed after removing the silicon oxide film 7 by etching. The gate insulating film may be a silicon oxynitride film, or a high-k gate insulating film such as HfSiO or the like. The gate electrode is formed by forming a gate electrode layer on the gate insulating film and patterning the gate electrode layer.

After forming sidewalls 9 on the side surfaces of the gate electrode, phosphorus is ion-implanted using the sidewalls 9 as a mask to form a phosphorus-introduced low concentration N-type LDD portion 4.

Then, as illustrated in FIG. 6, sidewalls 10 are additionally provided on the sidewalls 9 of the gate electrode, and an arsenic ion-implantation is performed using these sidewalls 9, 10 as a mask to form an arsenic-introduced high concentration N-type source and drain portions 3.

Although the N-channel MOS transistor has been described in detail as an example, even the P-channel MOS transistor is quite similar.

What is claimed is:

1. A semiconductor device comprising:
    first and second MOS transistors, each MOS transistor comprising source and drain regions formed on a main surface of a semiconductor substrate, a channel region sandwiched between the source and drain regions, and a gate electrode provided over the channel region through a gate insulating film;
    a circuit comprising the first MOS transistor whose gate is connected to a first signal line and the second MOS transistor whose gate is connected to a second signal line, the circuit outputting an output signal according to a difference in potential between the first signal line and the second signal line; and
    a third MOS transistor including source and drain regions formed on the main surface of the semiconductor substrate, a channel region sandwiched between the source and drain regions and a gate electrode provided over the channel region through a gate insulating film;
    wherein the channel regions of the first and second MOS transistors include no maximum impurity concentration at an area, which is shallower than a depth indicating a maximum concentration of one conduction type impurity that forms the source and drain regions, and
    the channel region of the third MOS transistor contains a second impurity whose concentration has a maximum value at a second depth and is simply decreased from the second depth toward the surface of the semiconductor substrate.

2. The semiconductor device according to claim 1, wherein the channel region of the third MOS transistor further contains a first impurity whose concentration has a maximum value at a first depth and is simply decreased from the first depth toward the surface of the semiconductor substrate.

3. The semiconductor device according to claim 1, wherein the channel regions of the first, second, and third MOS transistors contains a first impurity whose concentration has a maximum value at a first depth, which is deeper than the second depth, and is simply decreased from the first depth toward the surface of the semiconductor substrate.

4. The semiconductor device according to claim 1, wherein the circuit is a sense amplifier circuit of a DRAM.

5. The semiconductor device according to claim 1, wherein the circuit is a current mirror differential amplifier circuit.

6. The semiconductor device according to claim 1, wherein the gate insulating films of the first and second MOS transistors comprise a high-k gate insulating film.

7. The semiconductor device according to claim 1, wherein the channel regions of the first and second MOS transistors contain a first impurity whose concentration has a maximum value at an area, which is deeper than the depth indicating the maximum concentration of the one conduction type impurity that forms the source and drain regions, and is simply decreased from the depth indicating the maximum value of the concentration of the first impurity toward the surface of the semiconductor substrate.

8. The semiconductor device according to claim 7, wherein the first impurity comprises indium.

9. The semiconductor device according to claim 7, wherein the concentration of the first impurity on the surface of the semiconductor substrate is equal to or lower than 1E17.

10. The semiconductor device according to claim 1, wherein a width of the gate electrode of the first and second MOS transistors is larger than a width of the gate electrode of the third MOS transistor.

11. The semiconductor device according to claim 1, wherein the circuit is a sense amplifier circuit of a DRAM.

12. The semiconductor device according to claim 1, wherein the circuit is a current mirror differential amplifier circuit.

13. The semiconductor device according to claim 3, wherein the first impurity comprises indium.

14. A semiconductor device comprising:
    a first MOS transistor comprising source and drain regions formed on a main surface of a semiconductor substrate, a channel region sandwiched between the source and drain regions and a gate electrode provided over the channel region through a gate insulating film;
    a circuit comprising the first MOS transistor whose gate electrode receives an input signal having an intermediate potential between a power supply potential and a ground potential, the circuit outputting an output signal according to the potential of the input signal; and
    a third MOS transistor including source and drain regions formed on the main surface of the semiconductor substrate, a channel region sandwiched between the source and drain regions and a gate electrode provided over the channel region through a gate insulating film,
    wherein the channel region of the first MOS transistor includes no maximum impurity concentration at an area, which is shallower than a depth indicating a maximum concentration of one conduction type impurity that forms the source and drain regions, and
    the channel region of the third MOS transistor contains a second impurity whose concentration has a maximum value at a second depth and is simply decreased from the second depth toward the surface of the semiconductor substrate.

* * * * *